United States Patent [19]

Ozawa

[11] Patent Number: 5,304,838

[45] Date of Patent: Apr. 19, 1994

[54] VERTICAL RESISTIVE ELEMENT FOR INTEGRATED CIRCUIT MINIATURIZATION

[75] Inventor: Tadashi Ozawa, Tokyo, Japan

[73] Assignee: NEC Corporation, Japan

[21] Appl. No.: 751,788

[22] Filed: Aug. 29, 1991

[30] Foreign Application Priority Data

Aug. 31, 1990 [JP] Japan .................................. 2-231651

[51] Int. Cl.$^5$ ............................................. H01L 27/02
[52] U.S. Cl. ..................................... 257/542; 257/379; 257/516; 257/536
[58] Field of Search ......... 257/379, 516, 536, 539-543

[56] References Cited

U.S. PATENT DOCUMENTS

| | | | |
|---|---|---|---|
| 3,729,662 | 4/1973 | Langdon | 257/536 |
| 3,947,299 | 3/1976 | Weijland et al. | 257/516 |
| 4,272,776 | 6/1981 | Weijland et al. | 257/516 |
| 4,929,996 | 5/1990 | Hutter | 257/514 |
| 4,933,739 | 6/1990 | Harari | 257/539 |
| 4,979,001 | 12/1990 | Alter | 257/543 |
| 5,027,183 | 6/1991 | Dreps | 257/544 |

Primary Examiner—Rolf Hille
Assistant Examiner—Mahshid Saadat
Attorney, Agent, or Firm—Laff, Whitesel, Conte & Saret

[57] ABSTRACT

A semiconductor device comprises a semiconductor substrate of a first conductivity type; an epitaxial layer of a second conductivity type formed on the semiconductor substrate; an impurity diffusion layer of the second conductivity type embedded between the semiconductor substrate and the epitaxial layer and having an impurity concentration greater than that of the epitaxial layer; a resistance region reaching the impurity diffusion layer from a surface of the epitaxial layer and extending substantially vertically to the surface of the epitaxial layer; an insulating film defining the resistance region; and a lead region selectively formed between the surface of the epitaxial layer and the impurity diffusion layer.

6 Claims, 3 Drawing Sheets

VERTICAL RESISTIVE ELEMENT FOR INTEGRATED CIRCUIT MINIATURIZATION

BACKGROUND OF THE INVENTION

1. Field of the Invention

The present invention relates to a semiconductor device to be used as a resistance element in an integrated semiconductor circuit and a method of fabricating the same. Particularly, the present invention pertains to a semiconductor resistance element suitable for miniaturization and a method of fabricating the same.

2. Description of the Related Art

FIG. 1A is a plan view illustrating a conventional semiconductor resistance element, and FIG. 1B shows a cross section taken along the line III—III of FIG. 1A.

An N+-type diffusion layer 22 is selectively formed on the surface of a P-type silicon substrate 21. On the P-type silicon substrate 21 including the N+-type diffusion layer 22 is formed an N-type epitaxial layer 24 doped with phosphor or the like of $10^{15}$ to $10^{16}$ atoms/cm$^3$. In other words, the N+-type diffusion layer 22 is embedded between the P-type silicon substrate 21 and the N-type epitaxial layer 24. An oxide-film insulating region 25 which reaches the P-type silicon substrate 21 is selectively formed on the surface of the N-type epitaxial layer 24. The N+-type diffusion layer 22 and the N-type epitaxial layer 24 immediately atop the layer 22 are therefore isolated from the neighboring element(s). A P+-type diffusion region 23 is selectively formed on the surface of the P-type silicon substrate 21 immediately underlying the oxide-film insulating region 25 in order to prevent inversion between elements. P−-type resistance regions 27a to 27c are selectively formed on the surface of the N-type epitaxial layer 24 immediately on the N+-type diffusion layer 22 by implanting ionized boron or the like of $10^{17}$ to $10^{20}$ atoms/cm$^3$. The P−-type resistance regions 27a to 27c are rectangular from the plan view, and formed almost in parallel to one another. An insulating film 26 is adhered to the N-type epitaxial layer 24. Contact holes 28 are selectively formed in both end portions of each of the P−-type resistance regions 27a to 27c. Patterned on the insulating film 26 are a wiring 29 to be connected via one of the contact holes 28 to one end of the P−-type resistance region 27a and a wiring 30 to be connected via the other contact holes 28 to the other end of the resistance region 27a and the ends of the resistance regions 27b and 27c on the same side.

In the above-structured conventional semiconductor resistance element, the P−-type resistance regions 27a to 27c are isolated insulatively from the N-type epitaxial layer 24 by a depletion layer of a PN junction, thus acting as a resistance element. For example, if the boron concentration is $10^{17}$ atoms/cm$^3$, the P−-type resistance regions 27a to 27c will have its sheet resistance $\sigma_s$ of about several tens k$\Omega$/□. When the boron concentration is $10^{20}$ atoms/cm$^3$, the sheet resistance $\sigma_s$ will be about 100 $\Omega$/□. In other words, the lower the boron concentration is, the more the depletion layer tends to extend toward the P−-type resistance regions 27a to 27c. The effective sheet resistance $\sigma_s$ therefore will be larger.

The resistance R of the P−-type resistance regions 27a to 27c is represented by the equation (1).

$$R = \sigma_s L/W + r_0 \quad (1)$$

where L is the length ($\mu$m) between the contacts of the P−-type resistance regions 27a to 27c, W is the width ($\mu$m) of the P−-type resistance regions 27a to 27c, and $r_0$ is a lead contact resistance ($\Omega$).

The conventional semiconductor resistance element described above is, however, a planar electric resistance element. In order to acquire a high resistance R with a low sheet resistance $\sigma_s$, the resistance length L should be increased. In the case of acquiring a high resistance R with a high sheet resistance $\sigma_s$, since the amount of boron to be implanted tends to vary, the resistance width W should be increased so as to restrict a change in resistance R caused by the depletion layer. The semiconductor resistance element is therefore hard to be miniaturized.

SUMMARY OF THE INVENTION

It is therefore an object of the present invention to provide a semiconductor resistance element which can be designed more compact than the prior art, and a method of fabricating such a semiconductor resistance element.

To achieve this object, a semiconductor device according to the present invention comprises a semiconductor substrate of a first conductivity type; an epitaxial layer of a second conductivity type formed on said semiconductor substrate; an impurity diffusion layer of the second conductivity type embedded between the semiconductor substrate and the epitaxial layer and having an impurity concentration greater than that of the epitaxial layer; a resistance region reaching the impurity diffusion layer from a surface of the epitaxial layer and extending substantially vertically to the surface of the epitaxial layer; an insulating film defining the resistance region; and a lead region selectively formed between the surface of the epitaxial layer and the impurity diffusion layer.

Instead of the lead region, another resistance region defined by the insulating film may be provided.

A method of fabricating a semiconductor resistance element according to the present invention comprises the steps of selectively forming an impurity diffusion layer of a second conductivity type on a surface of a semiconductor substrate of a first conductivity type; growing an epitaxial layer of the second conductivity type on the semiconductor substrate; forming through etching a tubular groove surrounding a resistance-forming region of the epitaxial layer and reaching the impurity diffusion layer; and embedding an insulating film in the groove.

According to the present invention, the resistance region defined by an insulating film is formed on the epitaxial layer on the impurity diffusion layer so as to extend vertically to the surface of the epitaxial layer. This resistance region is led out via the impurity diffusion layer and the lead region. The resistance of the resistance region is determined according to the thickness and the specific resistance of the epitaxial layer as well as the width of the resistance region. Even if the resistance is altered to acquire the desired resistance, a region where the semiconductor resistance element is to be formed will not expand in parallel to the surface of the epitaxial layer. According to the present invention, therefore, the region for the semiconductor resistance element can be made smaller than the one in the prior art, thus ensuring miniaturization of the semiconductor resistance element.

According to this invention, another resistance region defined by the insulating film may be formed instead of the lead region. In this case, a pair of resistance regions can be connected together in series through the impurity diffusion layer, and the lead region is not particularly needed.

According to the method of the present invention, a semiconductor resistance element excellent for higher integration can easily be fabricated by the steps of selectively forming an impurity diffusion layer on a surface of a semiconductor substrate; growing an epitaxial layer on the semiconductor substrate; forming through etching a tubular groove surrounding a resistance-forming region of the epitaxial layer and reaching the impurity diffusion layer; and embedding an insulating film in the groove.

DETAILED DESCRIPTION OF THE PREFERRED EMBODIMENTS

Preferred embodiments of the present invention will now be described referring to the accompanying drawings.

Figure 1A:
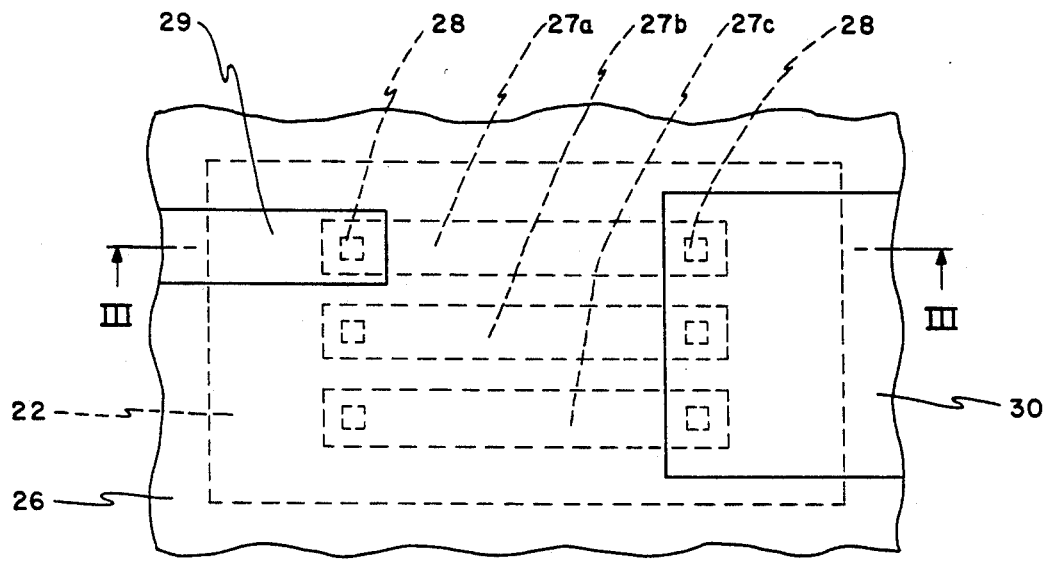
FIG. 1A is a plan view showing a conventional semiconductor resistance element.
Figure 1B:
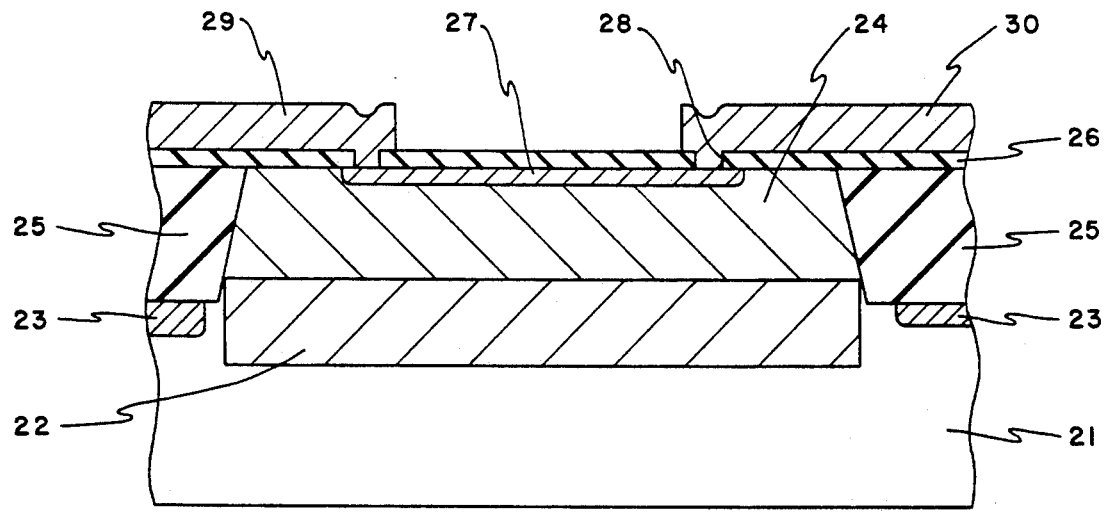
FIG. 1B shows a cross section taken along the line III—III of FIG. 1A.
Figure 2A:
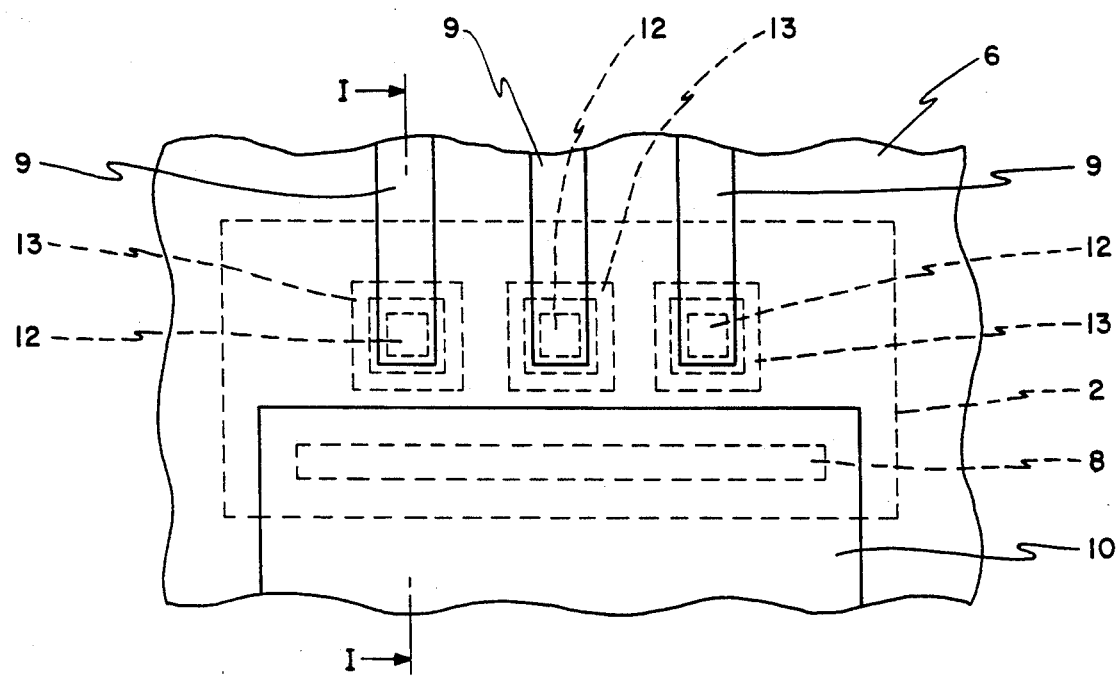
FIG. 2A is a plan view illustrating a semiconductor resistance element according to a first embodiment of the present invention.
Figure 2B:
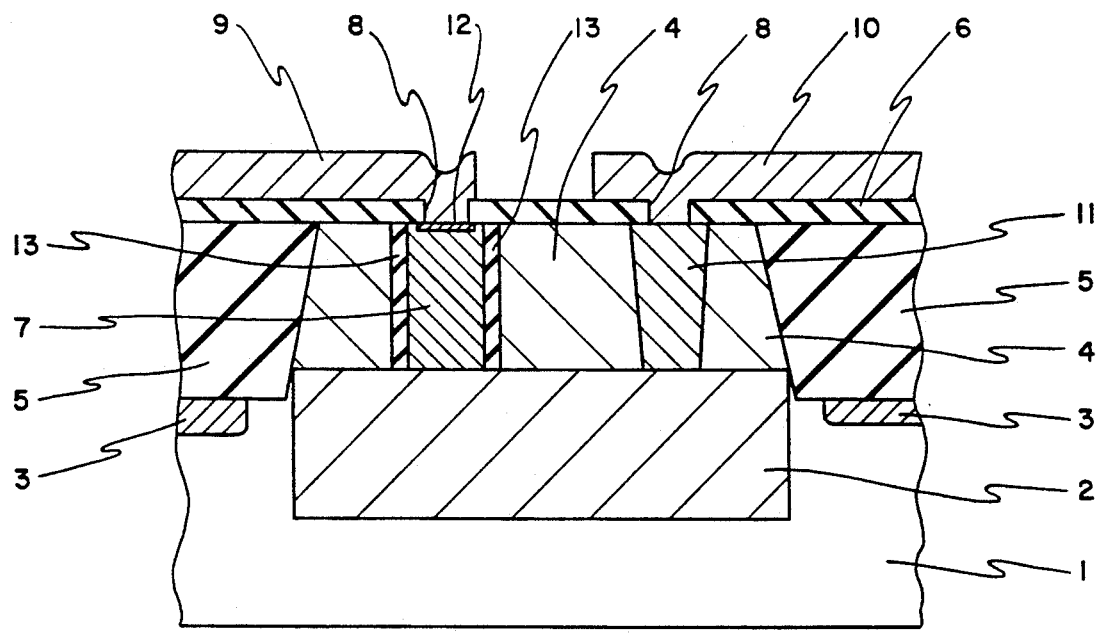
FIG. 2B shows a cross section taken along the line I—I of FIG. 2A.

FIG. 2A is a plan view illustrating a semiconductor resistance element according to a first embodiment of the present invention, and FIG. 2B shows a cross section taken along the line I—I of FIG. 2A.

An N+-type diffusion layer 2 is selectively formed on the surface of a P-type silicon substrate 1. On the P-type silicon substrate 1 including the N+-type diffusion layer 2 is formed an N-type epitaxial layer 4. In other words, the N+-type diffusion layer 2 is embedded between the P-type silicon substrate 1 and the N-type epitaxial layer 4. An oxide-film insulating region 5 which reaches the P-type silicon substrate 1 is selectively formed on the surface of the N-type epitaxial layer 4. The N+-type diffusion layer 2 and the N-type epitaxial layer 4 immediately overlying the layer 2 are therefore isolated from another element. A P+-type diffusion region 3 is selectively formed on the surface of the P-type silicon substrate 1 immediately underlying the oxide-film insulating region 5 in order to prevent inversion between elements.

An insulating film 13 extends from the surface of the N-type epitaxial layer 4 to the N+-type diffusion layer 2, locally enclosing the N-type epitaxial layer 4 from the plan view. The N-type resistance region 7 is thus defined in a rectangular area enclosed by the insulating film 13. The N-type resistance regions 7 of this type are provided at three locations in the N-type epitaxial layer 4.

An N+-type diffusion region 11 (lead region) is formed on the surface of the N-type epitaxial layer 4, reaching the N+-type diffusion layer 2.

An insulating film 6 is adhered to the N-type epitaxial layer 4. Contact holes 8 are selectively formed in the N-type resistance regions 7 and N+ diffusion region 11. Patterned on the insulating film 6 are wirings 9 to be connected via the contact holes 8 to the individual N-type resistance regions 7 and a wiring 10 to be connected via the remaining contact hole 8 to the N+ diffusion region 11.

On the surface of the N-type resistance region 7 is formed the N+-type diffusion region 12 having an impurity concentration of about $10^{18}$ atoms/cm$^3$, for example. The formation of the diffusion region 12 allows the wirings 9 to have an ohmic contact with the respective N-type resistance regions 7.

In the semiconductor resistance element as fabricated in the above manner, each N-type resistance region 7, which is formed substantially vertical to the surface of the N-type epitaxial layer 4, serves as a resistance element. Thus, a predetermined resistance is provided between the wirings 9 and 10 via the N+-type diffusion layer 2 and the N+-type diffusion regions 11 and 12. The N+-type diffusion layer 2 and the N+-type diffusion regions 11 and 12 have impurity concentrations sufficiently higher than that of the N-type resistance region 7. The resistance of the semiconductor resistance element is therefore determined by the resistance of the N-type resistance region 7. The resistance of the N-type resistance region 7 is determined by the thickness and the specific resistance of the N-type epitaxial layer 4 as well as the width of the N-type resistance region 7. In acquiring the desired resistance, therefore, the region for forming the semiconductor resistance element will not increase in parallel to surface of the P-type silicon substrate 1. According to the present invention, therefore, the area for forming the semiconductor resistance element can be reduced to $\frac{1}{3}$ to 1/10 of prior art.

A method of fabricating the above-described semiconductor resistance element will now be described.

The N+-type diffusion layer 2 and the P+-type diffusion region 3 are selectively formed on the surface of the P-type silicon substrate 1. Then the N-type epitaxial layer 4 of, for example, 1 to 2 $\mu$m thick is formed on the P-type silicon substrate 1 by the vacuum growth process. The oxide-film insulating region 5 is then selectively formed on the surface of the N-type epitaxial layer 4 by the selective oxidization process, extending to the P-type silicon substrate 1. As a result, the N+-type diffusion layer 2 and the N-type epitaxial layer 4 directly overlying the layer 2 are isolated from the neighboring element(s).

The N+-type diffusion region 11 is now selectively formed on the surface of the N-type epitaxial layer 4, reaching the N+-type diffusion layer 2.

A predetermined mask material is then patterned on the N-type epitaxial layer 4 by the photolithographic technique. The N-type epitaxial layer 4 is selectively removed from the N+-type diffusion layer 2 by dry etching using that mask material as a mask. Through this process, grooves of 0.5 to 1.5 $\mu$m wide and 1.5 to 2.5 $\mu$m deep, for example, are formed around the individual N-type resistance regions 7. The oxide insulating film 13 is deposited in the individual grooves, and the surface of the element is then flattened by the etch back process.

The insulating film 6 of, for example, 0.2 to 0.3 $\mu$m thick is formed on the entire surface of the element by the thermal oxidation process or the chemical vapor deposition (CVD). The contact holes 8 are selectively made through the insulating film 6. The N+-type diffusion region 12 is formed on the surface of the individual N-type resistance region 7, which is exposed into the contact hole 8. The wirings 9 and 10 are then patterned on the insulating film 6.

According to the method of this embodiment, it is possible to form the rectangular N-type resistance region 7 with one side of 2 μm long or longer in a plan pattern, by means of the photolithographic technique. Suppose that the N-type epitaxial layer 4 has a specific resistance of 1 Ω cm and a thickness of 1.0 μm. If the plan pattern of the N-type resistance region 7 is a square with one side about 2 μm long, several kΩ's of a resistance will be provided. When the plan pattern of the N-type resistance region 7 is a square about 5 μm across, several hundred kΩ's of a resistance will be obtained.

Figure 3A:
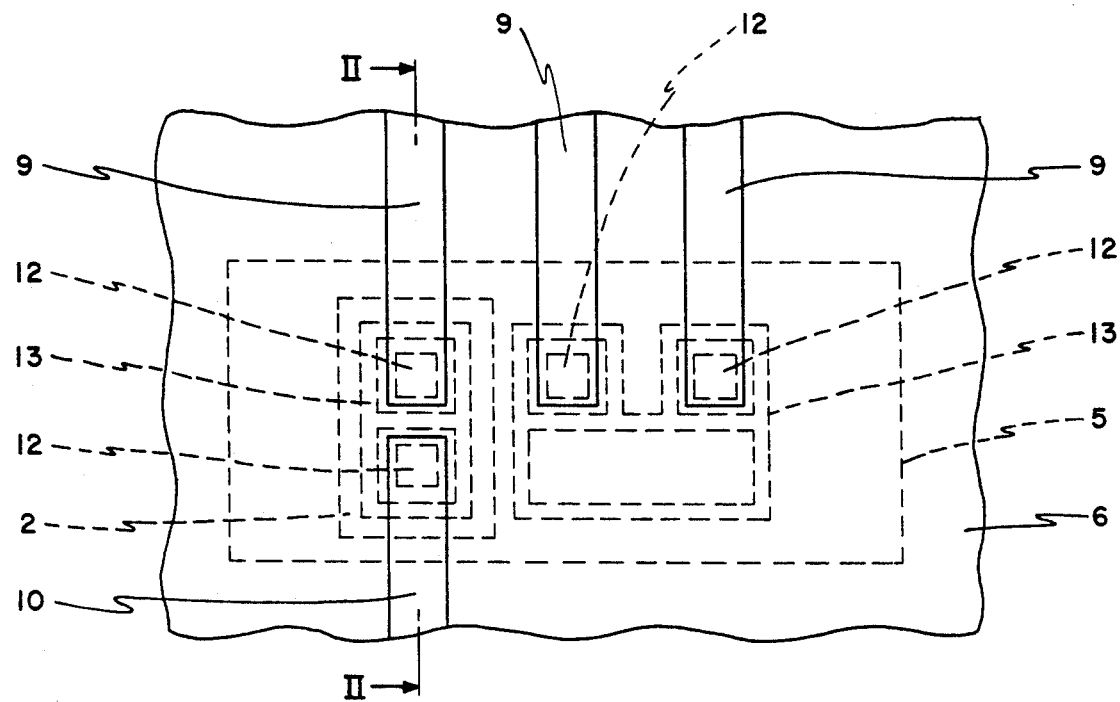
FIG. 3A is a plan view illustrating a semiconductor resistance element according to a second embodiment of the present invention.
Figure 3B:
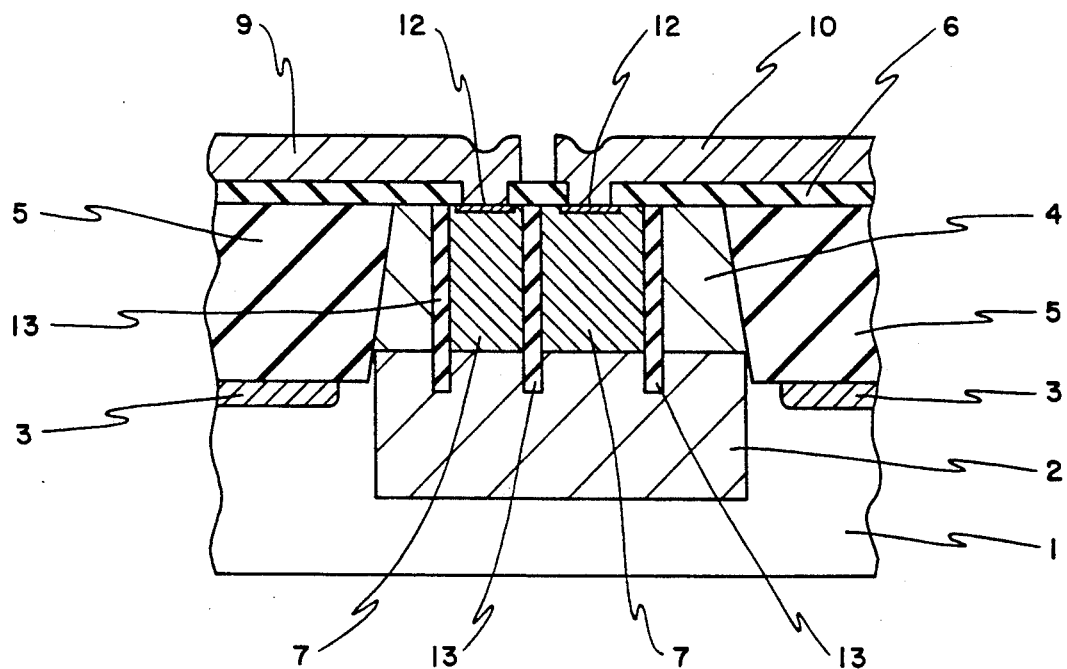
FIG. 3B shows a cross section taken along the line II—II of FIG. 3A.

FIG. 3A is a plan view illustrating a semiconductor resistance element according to a second embodiment of the present invention, and FIG. 3B shows a cross section taken along the line II—II of FIG. 3A. In this embodiment, the N+-type diffusion region 11 (lead region) in FIGS. 2A and 2B is simply replaced with another N-type resistance region 7, so that the same reference numerals as used for the first embodiment will be used to denote corresponding or identical components in FIGS. 3A and 3B to avoid their redundant description.

The insulating film 13 extends from the surface of the N-type epitaxial layer 4 to the N+-type diffusion layer 2, so that the N-type epitaxial layer 4 is locally enclosed by two regions from the plan view. The N-type resistance regions 7 are respectively defined in the two rectangular areas enclosed by the insulating films 13. Unlike in the first embodiment, the insulating film 13 is embedded slightly in the N+-type diffusion layer 2. The two N-type resistance regions 7 are connected via the N+-type diffusion region 12 to the wirings 9 and 10, respectively.

According to the second embodiment, the two N-type resistance regions 7 can be connected together in series via the N+-type diffusion layer 2. The second embodiment also has an advantage that it is unnecessary to provide the N+-type diffusion region 11 in the first embodiment as a lead region.

The semiconductor resistance element according to this embodiment can be fabricated in almost the same manner as the first embodiment.

What is claimed is:

1. A semiconductor device comprising:
    a semiconductor substrate of a first conductivity type;
    an epitaxial layer of a second conductivity type formed on said semiconductor substrate;
    an impurity diffusion layer of said second conductivity type embedded between said semiconductor substrate and said epitaxial layer and having an impurity concentration greater then that of said epitaxial layer;
    a resistance region formed in said epitaxial layer and reaching said impurity diffusion layer from a surface of said epitaxial layer and extending substantially vertically to said surface of said epitaxial layer;
    an insulating film defining said resistance region by enclosing a portion of said epitaxial layer; and
    a lead region selectively formed between said surface of said epitaxial layer and said impurity diffusion layer.

2. The semiconductor device according to claim 1, wherein said lead region is formed by another resistance region reaching said impurity diffusion layer from a surface of said epitaxial layer and extending substantially vertically to said surface of said epitaxial layer.

3. The semiconductor device according to claim 1, wherein the first conductivity type is a P-type and the second conductivity type is an N-type.

4. The semiconductor device according to claim 2, wherein the two resistance regions are formed adjacent to each other with an interposed insulating film.

5. The semiconductor device of claim 4 wherein said interposed insulating film defining said resistance regions extends into said impurity diffusion layer of said second conductivity type.

6. The semiconductor device of claim 4 wherein there are three of said interposed insulating films defining between themselves said two resistance regions, said three insulating films extending into said impurity diffusion layer of said second conductivity types.

* * * * *